(12) United States Patent
Chang Chien et al.

(10) Patent No.: US 11,637,071 B2
(45) Date of Patent: Apr. 25, 2023

(54) PACKAGE STRUCTURE INCLUDING MULTIPLE DIES SURROUNDED BY CONDUCTIVE ELEMENT AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/159,152

(22) Filed: Jan. 27, 2021

(65) Prior Publication Data

US 2022/0173051 A1    Jun. 2, 2022

(30) Foreign Application Priority Data

Nov. 27, 2020   (TW) .................................. 109141841

(51) Int. Cl.
*H01L 25/065*   (2006.01)
*H01L 23/552*   (2006.01)
(Continued)

(52) U.S. Cl.
CPC ............ *H01L 23/552* (2013.01); *H01L 24/19* (2013.01); *H01L 24/20* (2013.01); *H01L 24/96* (2013.01);
(Continued)

(58) Field of Classification Search
CPC ....... H01L 23/552; H01L 24/19; H01L 24/20; H01L 24/96; H01L 24/97; H01L 25/0655;
(Continued)

(56) References Cited

U.S. PATENT DOCUMENTS

| 2015/0098204 A1* | 4/2015 | Yoshikawa ............. H01L 23/00 361/767 |
| 2018/0190594 A1* | 7/2018 | Hsu .......................... H01L 24/19 |

(Continued)

FOREIGN PATENT DOCUMENTS

| TW | 201826476 | 7/2018 |
| TW | 202025409 | 7/2020 |
| TW | 202040761 | 11/2020 |

OTHER PUBLICATIONS

Office Action of Taiwan Counterpart Application, dated Feb. 23, 2021, pp. 1-4.

*Primary Examiner* — Didarul A Mazumder
(74) *Attorney, Agent, or Firm* — JCIPRNET (57) ABSTRACT

A package structure, including a conductive element, multiple dies, a dielectric body, a circuit layer and a patterned insulating layer, is provided. The multiple dies are disposed on the conductive element. A portion of the conductive element surrounds the multiple dies. The dielectric body covers the multiple dies. The circuit layer is disposed on the dielectric body. The circuit layer is electrically connected to the multiple dies. The patterned insulating layer covers the circuit layer. A portion of the patterned insulating layer is disposed between the dies that are adjacent. A manufacturing method of a package structure is also provided.

17 Claims, 9 Drawing Sheets

(51) Int. Cl.
*H01L 23/00* (2006.01)
*H01L 25/00* (2006.01)

(52) U.S. Cl.
CPC .......... *H01L 24/97* (2013.01); *H01L 25/0655* (2013.01); *H01L 25/50* (2013.01); *H01L 24/13* (2013.01); *H01L 2224/221* (2013.01); *H01L 2924/3025* (2013.01)

(58) Field of Classification Search
CPC ... H01L 25/50; H01L 24/13; H01L 2224/221; H01L 2924/3025
USPC ........................................................ 257/734
See application file for complete search history.

(56) References Cited

U.S. PATENT DOCUMENTS

2019/0378803 A1* 12/2019 Chang Chien .......... H01L 21/56
2021/0134711 A1* 5/2021 Fang ....................... H01L 24/81

\* cited by examiner

PACKAGE STRUCTURE INCLUDING MULTIPLE DIES SURROUNDED BY CONDUCTIVE ELEMENT AND MANUFACTURING METHOD THEREOF

CROSS-REFERENCE TO RELATED APPLICATION

This application claims the priority benefit of Taiwan application Ser. No. 109141841, filed on Nov. 27, 2020. The entirety of the above-mentioned patent application is hereby incorporated by reference herein and made a part of this specification.

BACKGROUND

Technical Field

This disclosure relates to a package structure and a manufacturing method thereof, and in particular to a package structure having multiple dies surrounded by a conductive element and a manufacturing method thereof.

Description of Related Art

In recent years, electronic devices have become increasingly important in the lives of people. Multiple independently operable dies may be integrated into one package structure to accelerate the integration of various functions and reduce the size of the package structure. Therefore, how to improve and reduce signal interference between the multiple dies that are in operation has become a pressing issue.

SUMMARY

This disclosure provides a package structure and a manufacturing method thereof, in which its manufacturing process is simple and has good yield and quality.

The package structure of the disclosure includes a conductive element, multiple dies, a dielectric body, a circuit layer and a patterned insulating layer. The multiple dies are disposed on the conductive element. A portion of the conductive element surrounds the multiple dies. The dielectric body covers the multiple dies. The circuit layer is disposed on the dielectric body. The circuit layer is electrically connected to the multiple dies. The patterned insulating layer covers the circuit layer. A portion of the patterned insulating layer is disposed between the dies that are adjacent.

The manufacturing method of the package structure of the disclosure includes the following steps. Multiple dies are disposed on a carrier. A dielectric material is formed on the carrier to cover the multiple dies. A dielectric body covering the multiple dies is formed by removing at least a portion of the dielectric material. A patterned conductive layer is formed on the dielectric body, and a portion of the patterned conductive layer is electrically connected to the multiple dies. A patterned insulating layer is formed to cover the patterned conductive layer, and a portion of the patterned insulating layer is disposed between the dies that are adjacent.

Based on the above, the carrier configured to carry in the manufacturing process of the package structure may serve as a portion of the conductive element in the package structure, while the second conductive portion, serving as the other portion of the conductive element, and the circuit layer configured to be electrically connected to the dies may be in the same film layer. In addition, the conductive element surrounding the dies can reduce the interference experienced by the dies due to the external electromagnetic wave signal. In this way, the manufacturing process of the package structure is simple, and the yield and quality of the package structure are good.

To make the abovementioned more comprehensible, several embodiments accompanied by drawings are described in detail as follows.

DESCRIPTION OF THE EMBODIMENTS

The directional terminology used in the text (for example, up, down, right, left, front, back, top, bottom) are only used with reference to the drawings and are not intended to imply absolute orientation. In addition, some of the layers or components may be omitted from the drawings for clarity.

Unless explicitly stated otherwise, any method described in the text is in no way intended to be interpreted as requiring its steps to be performed in a specific order.

The disclosure is described more comprehensively with reference to the drawings of the embodiment. However, the disclosure may also be embodied in various different forms and are not be limited to the exemplary embodiment described in the text. The thickness, dimensions, or size of the layers or regions in the drawings are exaggerated for clarity. The same or similar reference numerals indicate the same or similar elements, which will not be repeated one by one in the following paragraphs.

FIGS. 1A to 1E are schematic partial cross-sectional views of parts of a manufacturing method of a package structure according to a first embodiment of the disclosure. FIG. 1H is a schematic partial top view of a part of the manufacturing method of the package structure according to the first embodiment of the disclosure. For example, FIG. 1H may be a schematic top view corresponding to a region near a first die 110 and a second die 120 in FIG. 1B.

Figure 1A:
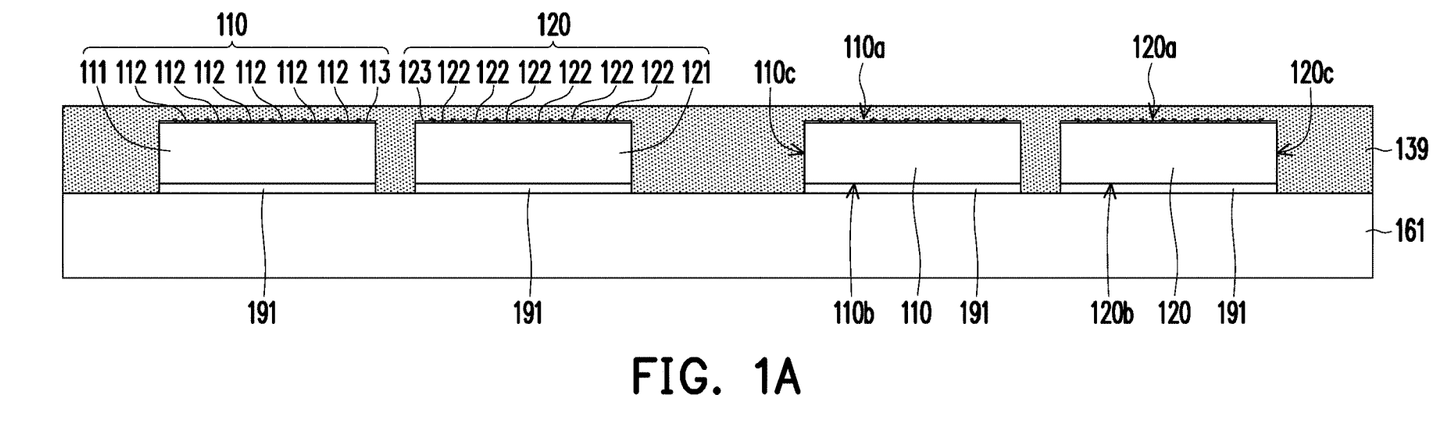
FIGS. 1A to 1E are schematic partial cross-sectional views of parts of a manufacturing method of a package structure according to a first embodiment of the disclosure.

With reference to FIG. 1A, a carrier 161 is provided. In an embodiment, in the subsequent manufacturing process, the carrier 161 may be suitable for carrying a structure formed thereon or components disposed thereon.

In the embodiment, the carrier 161 may include a bulk conductive carrier, but the disclosure is not limited thereto.

For example, the carrier 161 may include a block-shaped steel plate, a copper plate, an aluminum plate, and other suitable metal plates.

In an embodiment, a surface of the carrier 161 may be plated or coated with a suitable conductive material or film layer (which may be regarded as a portion of the carrier), but the disclosure is not limited thereto. For example, the carrier 161 may include a bulk insulating carrier, and a surface of the bulk insulating carrier may be plated or coated with a suitable conductive material or film layer.

With reference to FIG. 1A again, multiple dies are disposed on carrier 161. For example, the first die 110 and the second die 120 may be disposed on the carrier 161. In FIG. 1A, only two first dies 110 and two second dies 120 are exemplarily shown, but the disclosure is not limited thereto.

In the embodiment, the first die 110 may include a substrate 111, multiple first die connection pads 112, and a first die protective layer 113. A side of the substrate 111 has an element region (not shown), and a surface which the element region is disposed on may be referred to as a first active surface 110$a$. A surface opposite to the first active surface 110$a$ may be referred to as a first back surface 110$b$. A surface connecting the first active surface 110$a$ to the first back surface 110$b$ may be referred to as a first side surface 110$c$. The first die connection pad 112 may be disposed on the first active surface 110$a$. The first die protective layer 113 may cover the first die connection pad 112, and the first die protective layer 113 exposes a portion of the first die connection pad 112. In general die design, elements in the element region (such as the elements in the element region of the first die 110) may be electrically connected to a corresponding connection pad (such as the portion of the first die connection pad 112 of the first die 110) by a corresponding back end of line (BEOL) interconnection.

In the embodiment, the first die connection pad 112 is, for example, an aluminum pad or a copper pad, but the disclosure is not limited thereto.

In the embodiment, the second die 120 may include a substrate 121, multiple second die connection pads 122, and a second die protective layer 123. A side of the substrate 121 has an element region (not shown), and a surface which the element region is disposed on may be referred to as a second active surface 120$a$. A surface opposite to the second active surface 120$a$ may be referred to as a second back surface 120$b$. A surface that is between and connected to the second active surface 120$a$ and the second back surface 120$b$ may be referred to as a second side surface 120$c$.

In the embodiment, the second die 120 may be the same or similar to the first die 110. For example, the substrate 121 may be the same or similar to the substrate 111, the second die connection pad 122 may be the same or similar to the first die connection pad 112, and the second die protective layer 123 may be the same or similar to the first die protective layer 113. Therefore, details will not be repeated here.

In an embodiment, the first die 110 and the second die 120 may be a homogeneous die or a heterogeneous die, and are not limited by the disclosure.

In an embodiment, there may be an attaching layer 191 between the die (such as the first die 110, or the second die 120) and the carrier 161, but the disclosure is not limited thereto. The attaching layer 191 may include a die attach film layer (DAF), but the disclosure is not limited thereto.

With reference to FIG. 1A again, a dielectric material 139 is formed on the carrier 161. The dielectric material 139 may cover the first die 110 and the second die 120. For example, the dielectric material 139 may cover the first active surface 110$a$ and the first side surface 110$c$ of the first die 110, and the dielectric material 139 may cover the second active surface 120$a$ and the second side surface 120$c$ of the second die 120. In an embodiment, the dielectric material 139 may be formed by a coating method or other suitable processes, but the disclosure is not limited thereto. In an embodiment, the dielectric material 139 may be in direct contact with the first die connection pad 112 of the first die 110 and the second die connection pad 122 of the second die 120.

Figure 1B:
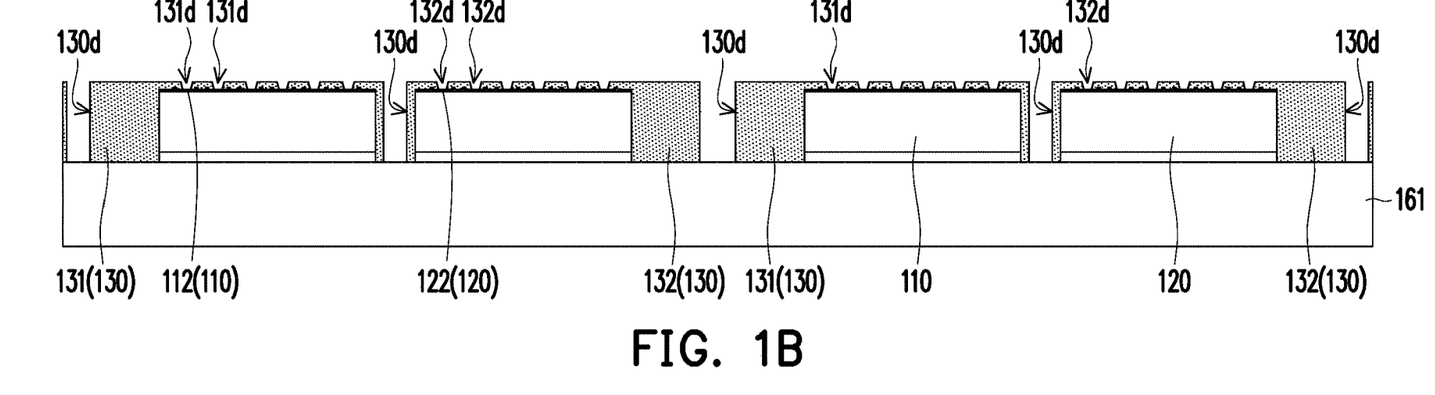
Figure 1C:
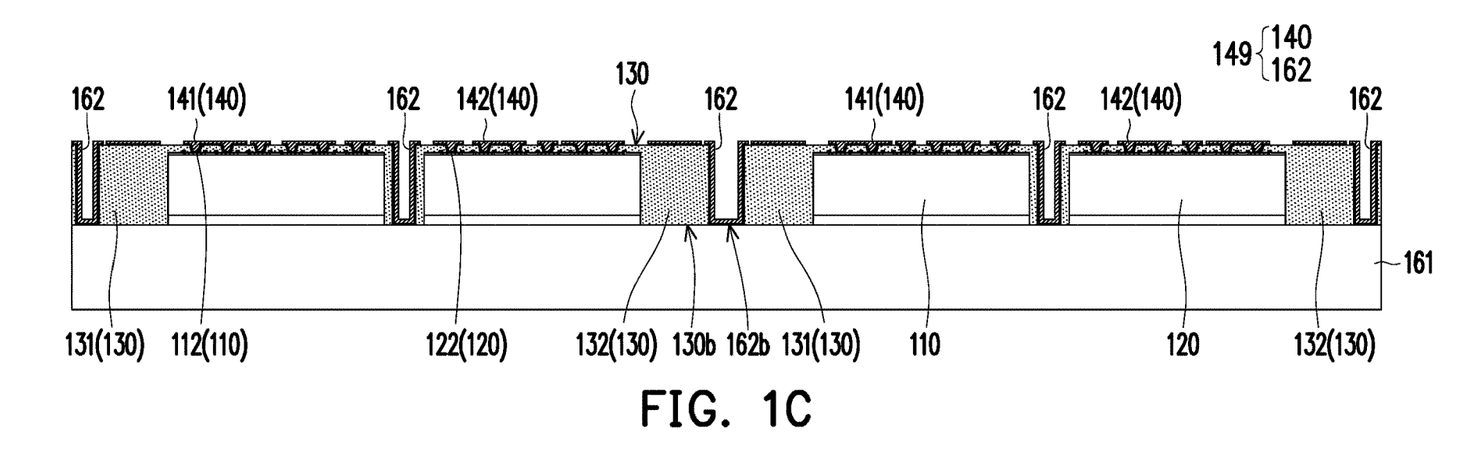
Figure 1D:
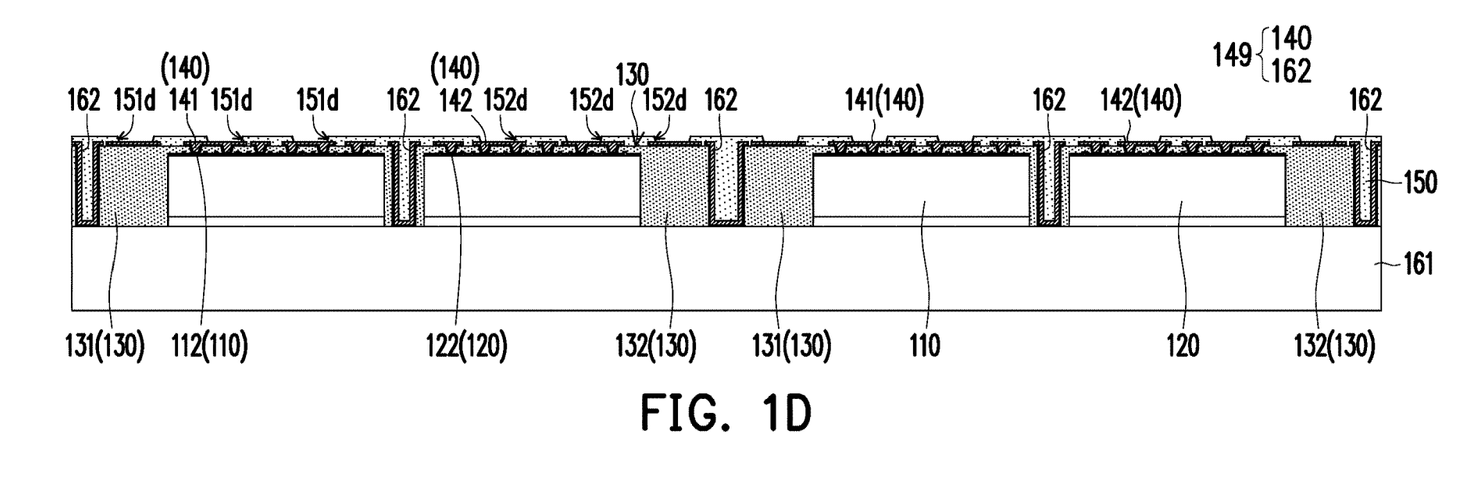
Figure 1E:
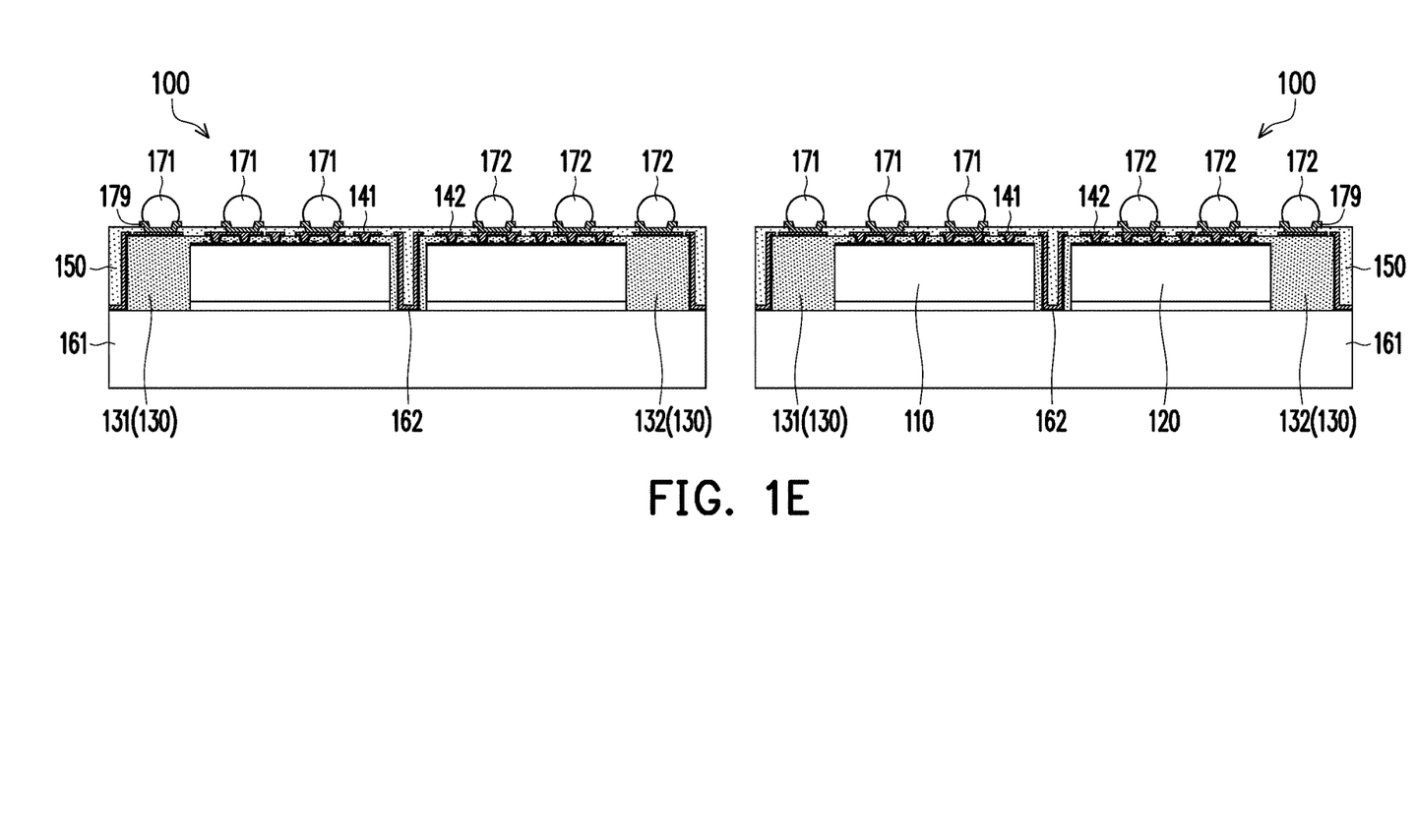
Figure 1F:
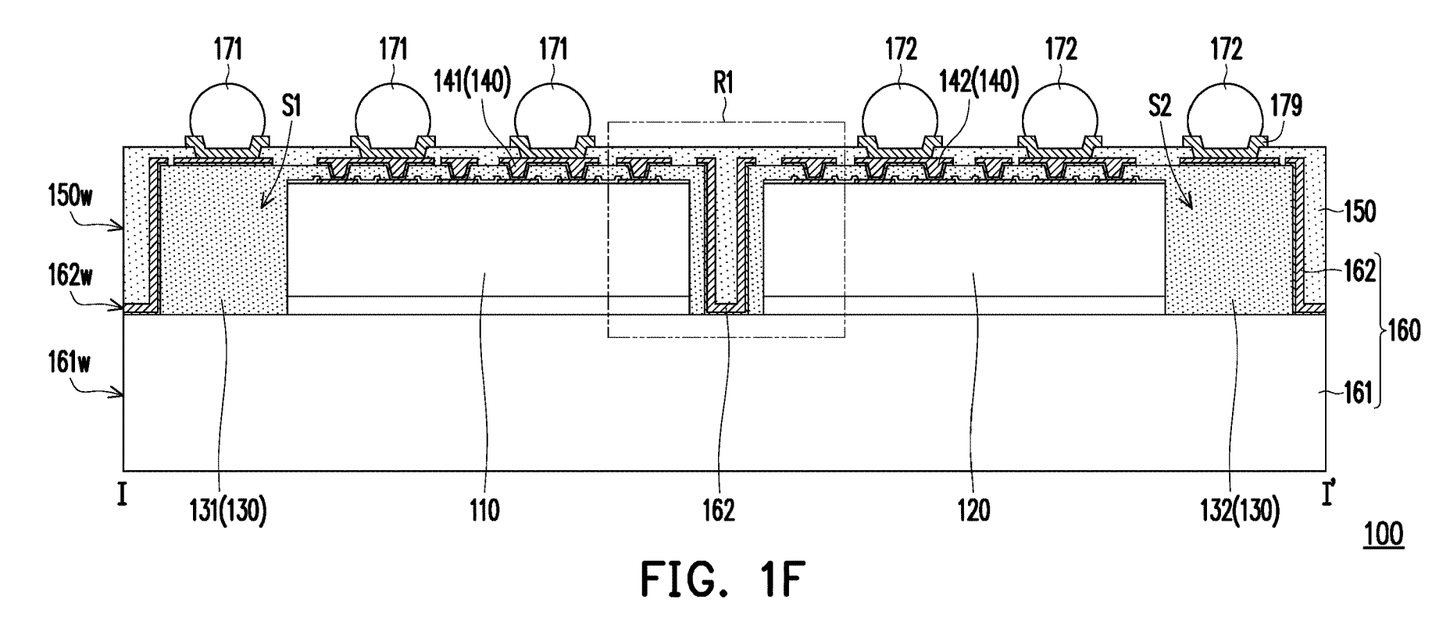
FIG. 1F is a schematic cross-sectional view of the package structure according to the first embodiment of the disclosure.
Figure 1G:
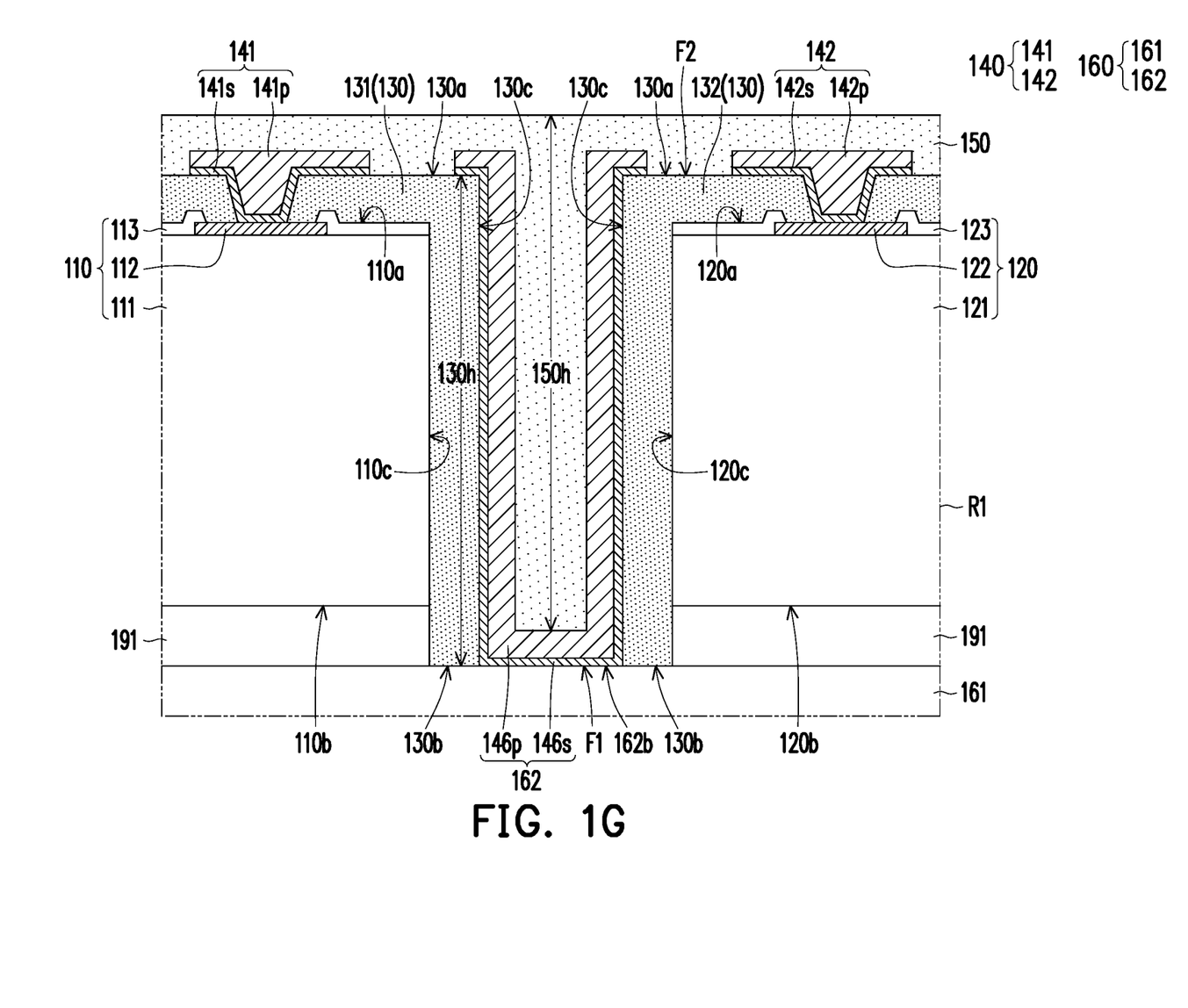
FIG. 1G is a schematic partial cross-sectional view of the package structure according to the first embodiment of the disclosure.
Figure 1H:
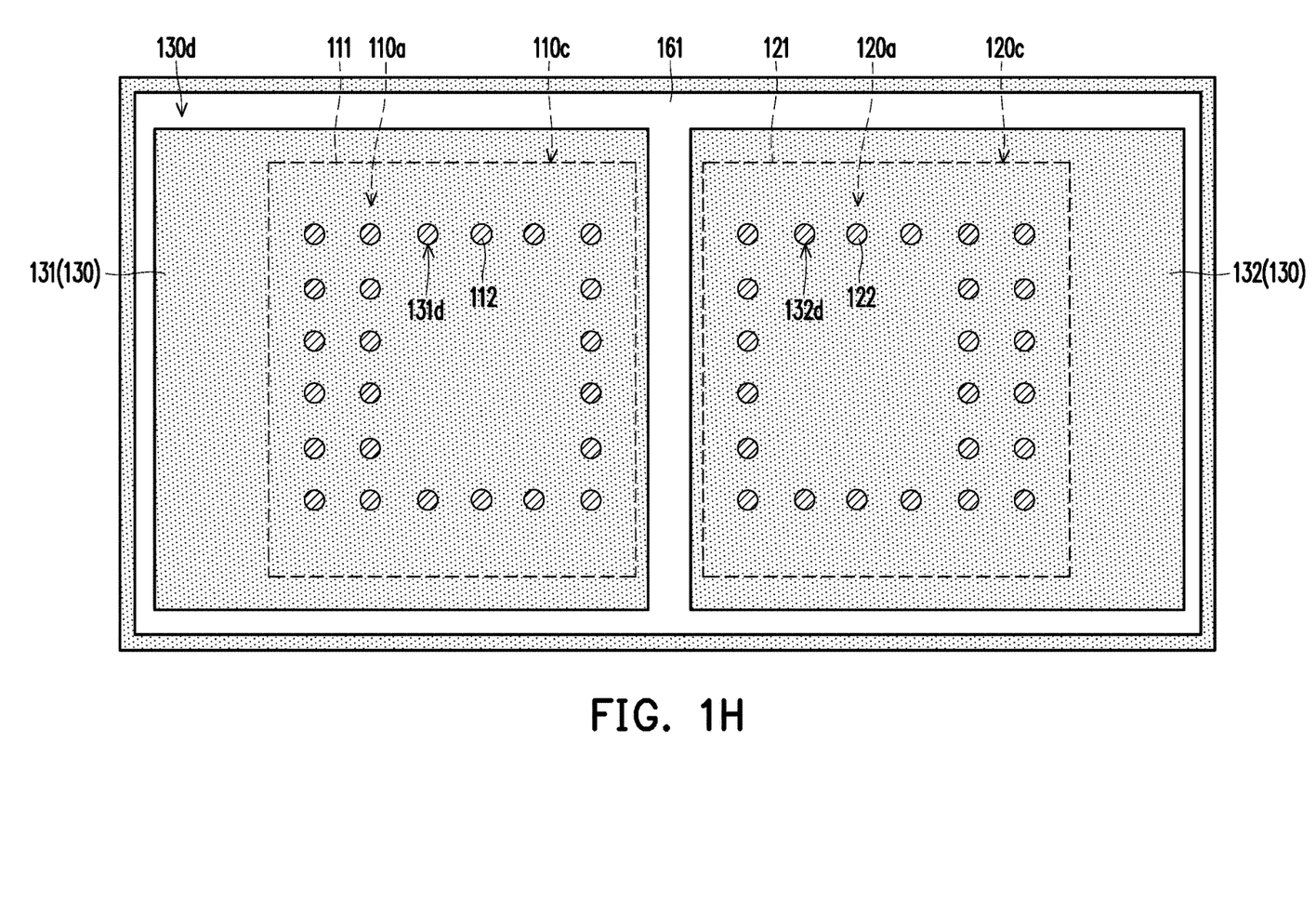
FIG. 1H is a schematic partial top view of a part of the manufacturing method of the package structure according to the first embodiment of the disclosure.

With reference to FIGS. 1A, 1B and 1H, at least a portion of the dielectric material 139 is removed, and then a dielectric body 130 covering the multiple dies may be formed.

In the embodiment, the dielectric material 139 may be a photoimageable dielectric (PID) material. In an embodiment, a portion of the photoimageable dielectric material may be cured by photopolymerization and/or baking. In addition, after the portion of the photoimageable dielectric material is cured, the remaining photoimageable dielectric material that is not cured may be removed by wet cleaning or other suitable means.

In an embodiment, a means of forming the dielectric body 130 may be adjusted according to its property, which is not limited by the disclosure.

In the embodiment, the dielectric body 130 may have a first dielectric via 131$d$, a second dielectric via 132$d$, and a trench 130$d$. The first dielectric via 131$d$ may expose the first die connection pad 112 of the first die 110, and the second dielectric via 132$d$ may expose the second die connection pad 122 of the second die 120. The trench 130$d$ may expose the carrier 161 or the film layer (if any) on the carrier 161.

In the embodiment, the dielectric body 130 may include multiple dielectric portions separated from each other by the trench 130$d$. In an embodiment, each of the dielectric portions may cover each of the dies. For example, the dielectric body 130 may include a first dielectric portion 131 and a second dielectric portion 132 separated from each other by the trench 130$d$. The first dielectric portion 131 may cover the first side surface 110$c$ of the first die 110 and a portion of the first active surface 110$a$. The second dielectric portion 132 may cover the second side surface 120$c$ of the second die 120 and a portion of the second active surface 120$a$.

With reference to FIGS. 1B and 1C, a patterned conductive layer 149 is formed on the carrier 161. The patterned conductive layer 149 may cover the dielectric body 130.

In the embodiment, the patterned conductive layer 149 may be formed by a sputtering process, a lithography process, an electroplating process, and/or an etching process, but the disclosure is not limited thereto. For example, a seed layer may be formed on a surface of the dielectric body 130 by the sputtering process. Then, a patterned photoresist layer may be formed on the seed layer by the lithography process. Then, a plating layer may be formed on a portion of the seed layer exposed by the patterned photoresist layer by the electroplating process. Then, the patterned photoresist layer and the other portion of the seed layer that is not covered by the plating layer may be removed by the etching process. Patterned seed layers 141$s$, 142$s$, and 146$s$ (denoted in FIG. 1G) and patterned plating layers 141$p$, 142$p$, and 146$p$ (denoted in FIG. 1G) disposed thereon may constitute the patterned conductive layer 149.

In the embodiment, the patterned conductive layer 149 may include a circuit layer 140 and a second conductive portion 162. The circuit layer 140 may be electrically connected to the multiple dies. The second conductive portion 162 may conformally cover the trench 130$d$ (denoted in FIG. 1B or FIG. 1H). That is, the second conductive portion 162 filled in the trench 130*d* may be disposed between the first dielectric portion 131 and the second dielectric portion 132.

In the embodiment, the circuit layer 140 may include a first circuit 141. The first circuit 141 may be disposed on the first dielectric portion 131, and the first circuit 141 may completely fill the first dielectric via 131*d* (denoted in FIG. 1B or FIG. 1H). In other words, the first circuit 141 may be in direct contact with the first die connection pad 112 of the first die 110. For example, the patterned seed layer 141*s* (denoted in FIG. 1G) belonging to the first circuit 141 may be in direct contact with the first die connection pad 112 of the first die 110. A layout design of the first circuit 141 may be adjusted according to design requirements, which is not limited by the disclosure.

In an embodiment, a layout region of the first circuit 141 may be larger than the first active surface 110*a* of the first die 110. In an embodiment, the first circuit 141 may be referred to as a fan-out circuit.

In the embodiment, the circuit layer 140 may include a second circuit 142. The second circuit 142 may be disposed on the second dielectric portion 132, and the second circuit 142 may completely fill the second dielectric via 132*d* (denoted in FIG. 1B or FIG. 1H). In other words, the second circuit 142 may be in direct contact with the second die connection pad 122 of the second die 120. For example, the patterned seed layer 142*s* (denoted in FIG. 1G) belonging to the second circuit 142 may be in direct contact with the second die connection pad 122 of the second die 120. A layout design of the second circuit 142 may be adjusted according to the design requirements, which is not limited by the disclosure.

In an embodiment, a layout region of the second circuit 142 may be larger than the second active surface 120*a* of the second die 120. In an embodiment, the second circuit 142 may be referred to as a fan-out circuit.

In the embodiment, the second conductive portion 162 may be disposed on the first dielectric portion 131 and the second dielectric portion 132, and the second conductive portion 162 may further extend to bottom of the trench 130*d*. In an embodiment, the second conductive portion 162 extending to the trench 130*d* may conformally cover the bottom and side walls of the trench 130*d*. In an embodiment, a bottom surface 162*b* of the second conductive portion 162 covering the bottom of the trench 130*d* (denoted in FIG. 1B or FIG. 1H) may be coplanar with a dielectric bottom surface 130*b* of the dielectric body 130.

In the embodiment, the second conductive portion 162 disposed at the bottom of the trench 130*d* may be in contact with the carrier 161. For example, a portion of the patterned seed layer 146*s* (denoted in FIG. 1G) belonging to the second conductive portion 162 may be in direct contact with the carrier 161.

In the embodiment, the second conductive portion 162 and the carrier 161 are formed by different steps. In this way, there may be an interface F1 (denoted in FIG. 1G) between the second conductive portion 162 and the carrier 161 that are in contact with each other. For example, the interface F1 may be between the portion of the patterned seed layer 146*s* (denoted in FIG. 1G) belonging to the second conductive portion 162 and the carrier 161.

In the embodiment, the first circuit 141 and the second circuit 142 may be electrically separated from each other. In an embodiment, the first circuit 141 and the second conductive portion 162 may be electrically separated from each other. In an embodiment, the second circuit 142 and the second conductive portion 162 may be electrically separated from each other.

With reference to FIGS. 1C to 1D, a patterned insulating layer 150 is formed on the carrier 161. The material of the patterned insulating layer 150 may include inorganic materials, organic materials, other suitable insulating materials or a stack of the above, but the disclosure is not limited thereto. In an embodiment, the formation means of the patterned insulating layer 150 may be adjusted according to its property, and is not limited by the disclosure.

In the embodiment, the patterned insulating layer 150 may cover the patterned conductive layer 149. The patterned insulating layer 150 may have multiple insulating vias to expose a portion of the patterned conductive layer 149. For example, a first insulating via 151*d* may expose a portion of the first circuit 141, and a second insulating via 152*d* may expose a portion of the second circuit 142.

In the embodiment, a portion of the patterned insulating layer 150 may be disposed between the dies that are adjacent. For example, the portion of the patterned insulating layer 150 may further extend into the trench 130*d* (denoted in FIG. 1B or FIG. 1H), and may be disposed between the first die 110 and the second die 120. In other words, the patterned insulating layer 150 filled in the trench 130*d* may be disposed between the first dielectric portion 131 and the second dielectric portion 132.

In the embodiment, the patterned insulating layer 150 may be in contact with the dielectric body 130. For example, the patterned insulating layer 150 may be in direct contact with a portion of a dielectric top surface 130*a* of the dielectric body 130.

In the embodiment, the patterned insulating layer 150 and the dielectric body 130 are formed by different steps. In this way, there may be an interface F2 (denoted in FIG. 1G) between the patterned insulating layer 150 and the dielectric body 130 that are in contact with each other.

With reference to FIGS. 1D and 1E, multiple conductive terminals may be formed after forming the patterned insulating layer 150. The conductive terminals may be electrically connected to the first circuit 141 or the second circuit 142 in the circuit layer 140. For example, the conductive terminals may include a first conductive terminal 171 and a second conductive terminal 172. The first conductive terminal 171 may be electrically connected to the first circuit 141. The second conductive terminal 172 may be electrically connected to the second circuit 142.

Forms or shapes of the conductive terminals 171 and 172 may include a conductive pillar, a solder ball, a conductive bump, or other forms or shapes. The conductive terminals 171 and 172 may be formed through plating, deposition, ball placement, reflow, and/or other suitable processes.

In the embodiment, there may be other conductive layers (such as a conductive layer 179) or other corresponding insulating layers (not shown) between the conductive terminals 171 and 172 and the circuit layer 140. It should be noted that the disclosure does not limit the number of layers of the conductive layer. In an embodiment, the conductive layer 179 in contact with the conductive terminals 171 and 172 may be referred to as an under-ball metallurgy (UBM).

With reference to FIGS. 1D and 1E again, in the embodiment, multiple package structures 100 may be formed through a singulation process. The singulation process may include, for example, a dicing process/cutting process to cut through the carrier 161, the second conductive portion 162 of the patterned conductive layer 149 and/or the portion of the patterned insulating layer 150 filled in the trench 130d (marked in FIG. 1B or FIG. 1H).

It should be noted that similar element reference numerals are applied to the singulated elements after the singulation process. For example, the carrier 161 (as shown in FIG. 1D) may be the carrier 161 (as shown in FIG. 1E) after singulation, and the first die 110 (as shown in FIG. 1D) may be the first die 110 (as shown in FIG. 1E) after singulation, the second die 120 (as shown in FIG. 1D) may be the second die 120 (as shown in FIG. 1E) after singulation, the first dielectric portion 131 (as shown in FIG. 1D) may be the first dielectric portion 131 (as shown in FIG. 1E) after singulation, the second dielectric portion 132 (as shown in FIG. 1D) may be the second dielectric portion 132 (as shown in FIG. 1E) after singulation, the circuit 141 (as shown in FIG. 1D) may be the first circuit 141 (as shown in FIG. 1E) after singulation, the second circuit 142 (as shown in FIG. 1D) may be the second circuit 142 (as shown in FIG. 1E) after singulation, and the patterned insulating layer 150 (as shown in FIG. 1D) may be the patterned insulating layer 150 (as shown in FIG. 1E) after singulation, and so on. Other singulated elements follows the same element reference numerals rules described above, and will not be repeated or particularly illustrated here.

It should be noted that the disclosure does not limit sequence of disposition of the conductive terminal 171 (if any) and the conductive terminal 172 (if any), and the singulation process (if any).

FIG. 1F is a schematic cross-sectional view of the package structure according to the first embodiment of the disclosure. With reference to FIG. 1F, production of the package structure 100 of the embodiment may be roughly completed after the above steps.

In the embodiment, a side wall 161w of the carrier 161 and a side wall 150w of the patterned insulating layer 150 may be enabled to be substantially flush by the same or similar cutting process as described above. In an embodiment, the side wall 161w of the carrier 161, a side wall 162w of the second conductive portion 162, and the side wall 150w of the patterned insulating layer 150 may be enabled to be substantially flush by the same or similar cutting process as described above.

In an embodiment, the patterned insulating layer 150 may expose a portion of the second conductive portion 162 through the same or similar cutting process as described above. For example, the patterned insulating layer 150 may expose the side wall 162w of the second conductive portion 162.

In the embodiment, the carrier 161 and the second conductive portion 162 electrically connected to each other may be referred to as a conductive element 160. The conductive element 160 has corresponding accommodation spaces, and the multiple dies 110 and 120 are disposed in the corresponding accommodation spaces. For example, the conductive element 160 may have a first accommodation space S1 and a second accommodation space S2, the first die 110 is disposed in the first accommodation space S1, and the second die 120 is disposed in the second accommodation space S2.

Figure 1I:
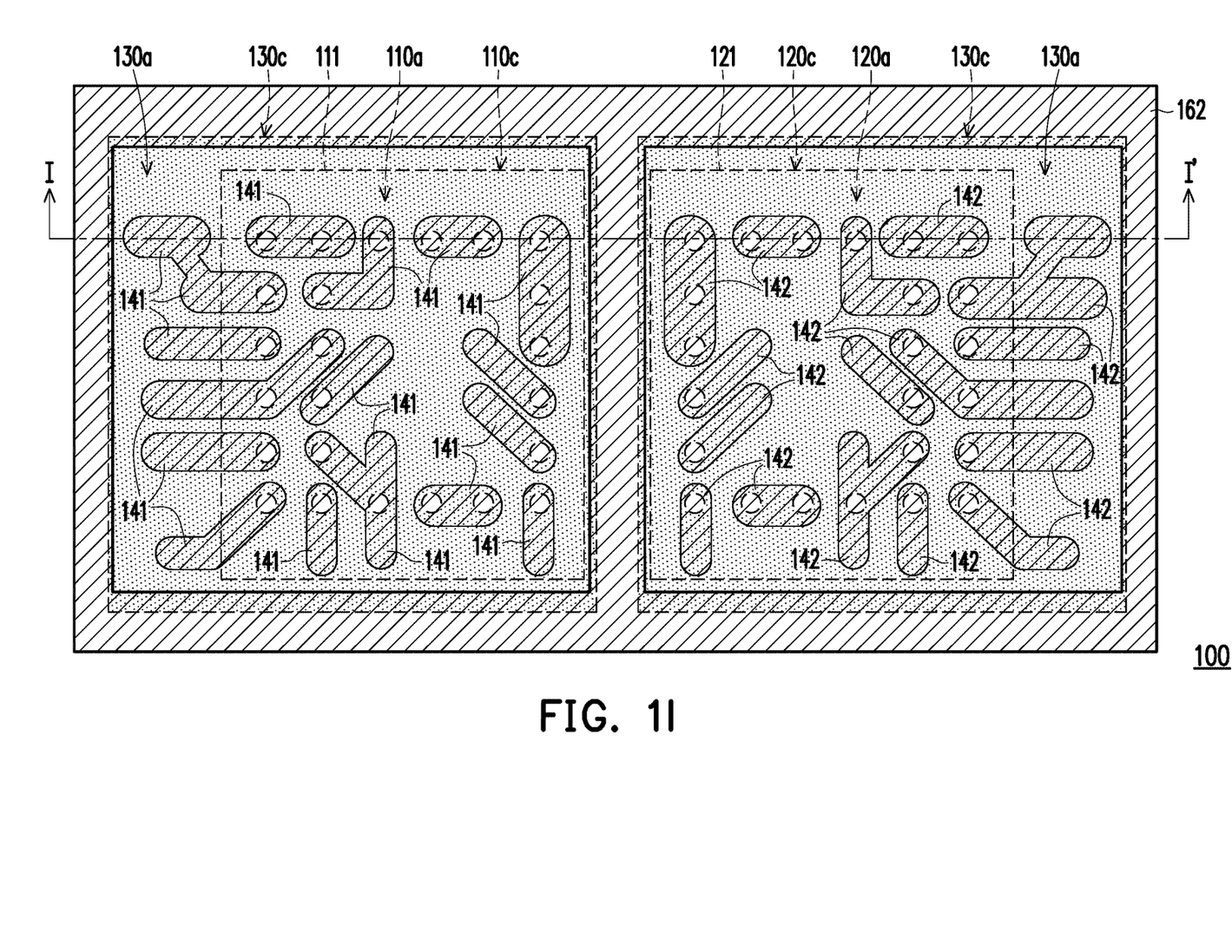
FIG. 1I is a schematic partial top view of the package structure according to the first embodiment of the disclosure.

FIG. 1G is a schematic partial cross-sectional view of the package structure according to the first embodiment of the disclosure. FIG. 1I is a schematic partial top view of the package structure according to the first embodiment of the disclosure. FIG. 1G may be an enlarged view corresponding to a region R1 in FIG. 1F. The schematic cross-sectional view of FIG. 1F may correspond to a position on the line I-I' in FIG. 1I. In addition, some of the film layers or components are omitted in FIG. 1I for clarity. For example, the patterned insulating layer 150 and the conductive terminals 171 and 172 are omitted in FIG. 1I.

With reference to FIGS. 1F, 1G and 1I, the package structure 100 includes the conductive element 160, the multiple dies 110 and 120, the dielectric body 130, the circuit layer 140, and the patterned insulating layer 150.

The dies 110 and 120 are disposed on the conductive element 160 and a portion of the conductive element 160 surrounds the dies 110 and 120. For example, the first die 110 and the second die 120 may be disposed on the carrier 161 (which may be referred to as a first conductive portion of the conductive element 160) that constitutes the conductive element 160, and the second conductive portion 162 that constitutes the conductive element 160 may surround the first die 110 and the second die 120.

The dielectric body 130 covers the multiple dies 110 and 120. For example, the dielectric body 130 may include the first dielectric portion 131 and the second dielectric portion 132 separated from each other. The first dielectric portion 131 may cover the first die 110, and the second dielectric portion 132 may cover the second die 120.

In the embodiment, the dielectric body 130 may have the dielectric top surface 130a, the dielectric bottom surface 130b, and a dielectric side surface 130c. The dielectric bottom surface 130b is opposite to the dielectric top surface 130a, and the dielectric side surface 130c is connected to the dielectric top surface 130a and the dielectric bottom surface 130b. The second conductive portion 162 that constitutes the conductive element 160 may cover the dielectric side surface 130c. For example, the second conductive portion 162 may surround and cover the dielectric side surface 130c of the first dielectric portion 131 and the dielectric side surface 130c of the second dielectric portion 132.

The circuit layer 140 is disposed on the dielectric top surface 130a of the dielectric body 130 and is electrically connected to the dies 110 and 120. For example, the circuit layer 140 may include the first circuit 141 and the second circuit 142. The first circuit 141 may be electrically connected to the first die 110, and the second circuit 142 may be electrically connected to the second die 120.

In the embodiment, the first circuit 141 and the second circuit 142 may be electrically separated from each other. Furthermore, the conductive element 160 may shield an electromagnetic wave signal between the first die 110 and the second die 120. In this way, the signals of the first die 110 and the second die 120 may be separated from each other, and unintended interference between the first die 110 and the second die 120 due to the electromagnetic wave signal may also be reduced.

In the embodiment, the second conductive portion 162 that constitutes the conductive element 160 and the circuit layer 140 may be in a same film layer. For example, the second conductive portion 162 and the circuit layer 140 may be formed through the same steps (such as the steps shown in FIG. 1C), and the second conductive portion 162 and the circuit layer 140 include the corresponding seed layers 141s, 142s, and 146s, and the corresponding plated layers 141p, 142p, and 146p. In another example, the seed layer 141s, the seed layer 142s, and the seed layer 146s are basically in the same film layer, and the plating layer 141p, the plating layer 142p, and the plating layer 146p are basically in the same film layer.

The patterned insulating layer 150 covers the circuit layer 140, and the portion of the patterned insulating layer 150 is disposed between the first die 110 and the second die 120 that are adjacent to each other.

In the embodiment, the patterned insulating layer 150 may surround the second conductive portion 162. For example, the patterned insulating layer 150 may surround and cover the second conductive portion 162 on the dielectric side surface 130c. In this way, a possibility of the second conductive portion 162 peeling off may be reduced.

In the embodiment, a maximum thickness 150h of the patterned insulating layer 150 may be greater than a maximum thickness 130h of the dielectric body 130, but the disclosure is not limited thereto.

In the embodiment, the carrier 161 may be a block-shaped metal plate or other suitable conductive block-shaped carrier. During the manufacturing process of the package structure 100, the carrier 161 may be suitable for carrying the structure formed thereon or the components arranged thereon. In addition, the carrier 161, which is a portion of the conductive element 160, may reduce the unexpected interference between the first die 110 and/or the second die 120 due to the electromagnetic wave signal. Moreover, the carrier 161 may be thermally coupled to the first die 110 and/or the second die 120. In other words, the carrier 161 configured to carry in the manufacturing process of the package structure 100 may serve as an electromagnetic interference (EMI) shield and/or a heat dissipation component in the package structure 100. In this way, the manufacturing process of the package structure 100 may be simple. In addition, yield and quality of the package structure 100 are good.

In the embodiment, the second conductive portion 162 that constitutes the conductive element 160 and the circuit layer 140 may be in the same film layer that is formed in the same step. In this way, the manufacturing process of package structure 100 may be enabled to be simple. In addition, the yield and quality of the package structure 100 are good.

In an embodiment, the carrier 161 may be a block-shaped plate that is not patterned (such as not having a perforation or a depression). In this way, the manufacturing process of package structure 100 may be enabled to be simple. In addition, the yield and quality of the package structure 100 are good.

Figure 2:
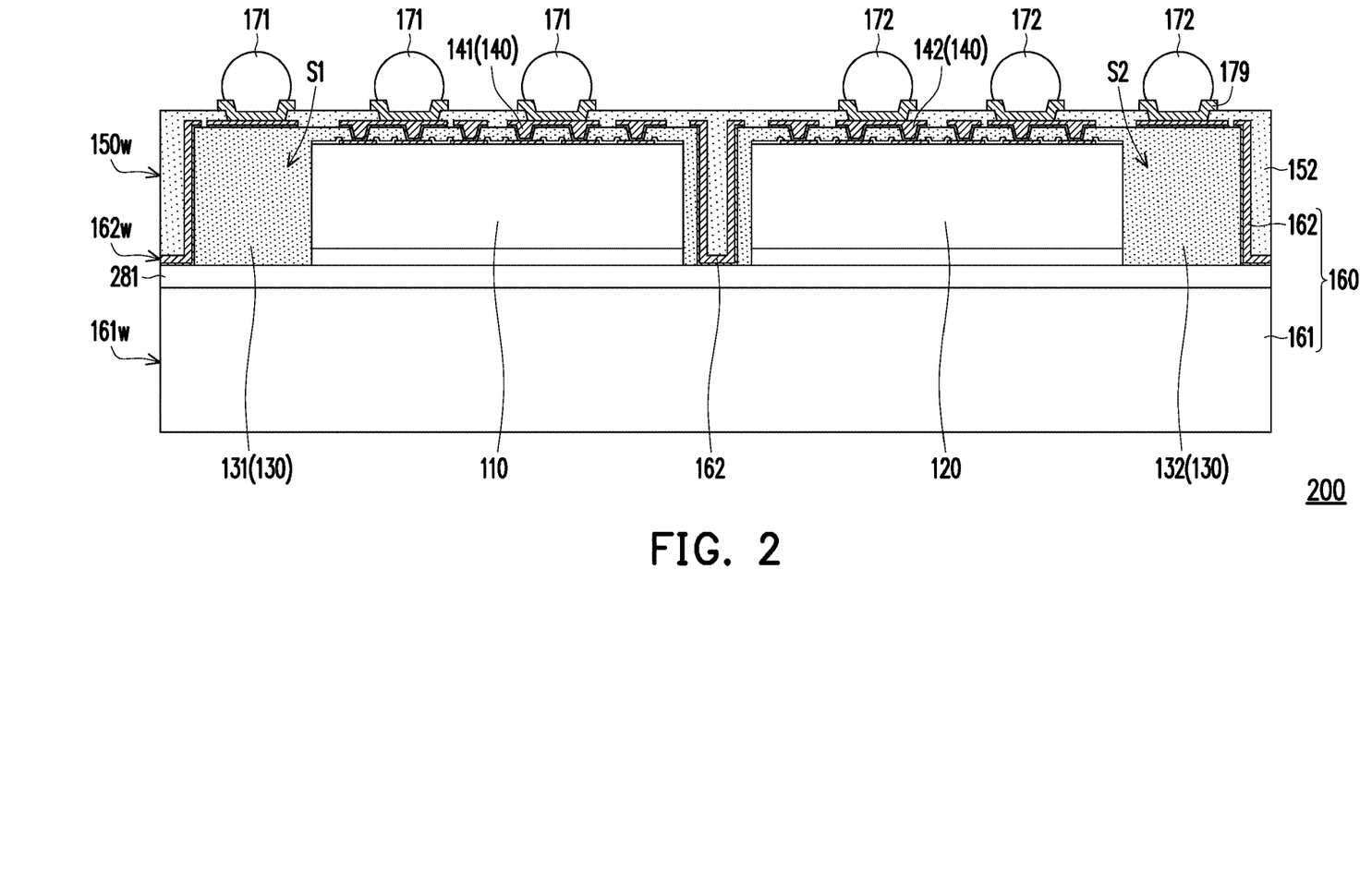
FIG. 2 is a schematic partial cross-sectional view of a package structure according to a second embodiment of the disclosure.

FIG. 2 is a schematic partial cross-sectional view of a package structure according to a second embodiment of the disclosure. A package structure 200 of the second embodiment is similar to the package structure 100 of the first embodiment, and similar components of the package structure 200 are denoted by the same reference numerals, and have similar functions, materials, or formation means, therefore the description is omitted.

With reference to FIG. 2, the package structure 200 may include the conductive element 160, the multiple dies 110 and 120, the dielectric body 130, the circuit layer 140, the patterned insulating layer 150, and a thermal interface material (TIM) layer 281. The thermal interface material layer 281 may include a thermally conductive adhesive, a thermally conductive paste, a thermally conductive film layer, or a thermally conductive tape having a conductive material (such as a conductive particle), but the disclosure is not limited thereto. In an embodiment, the thermal interface material layer 281 may improve thermal coupling between the carrier 161 and the die (such as the first die 110 and/or the second die 120).

Figure 3:
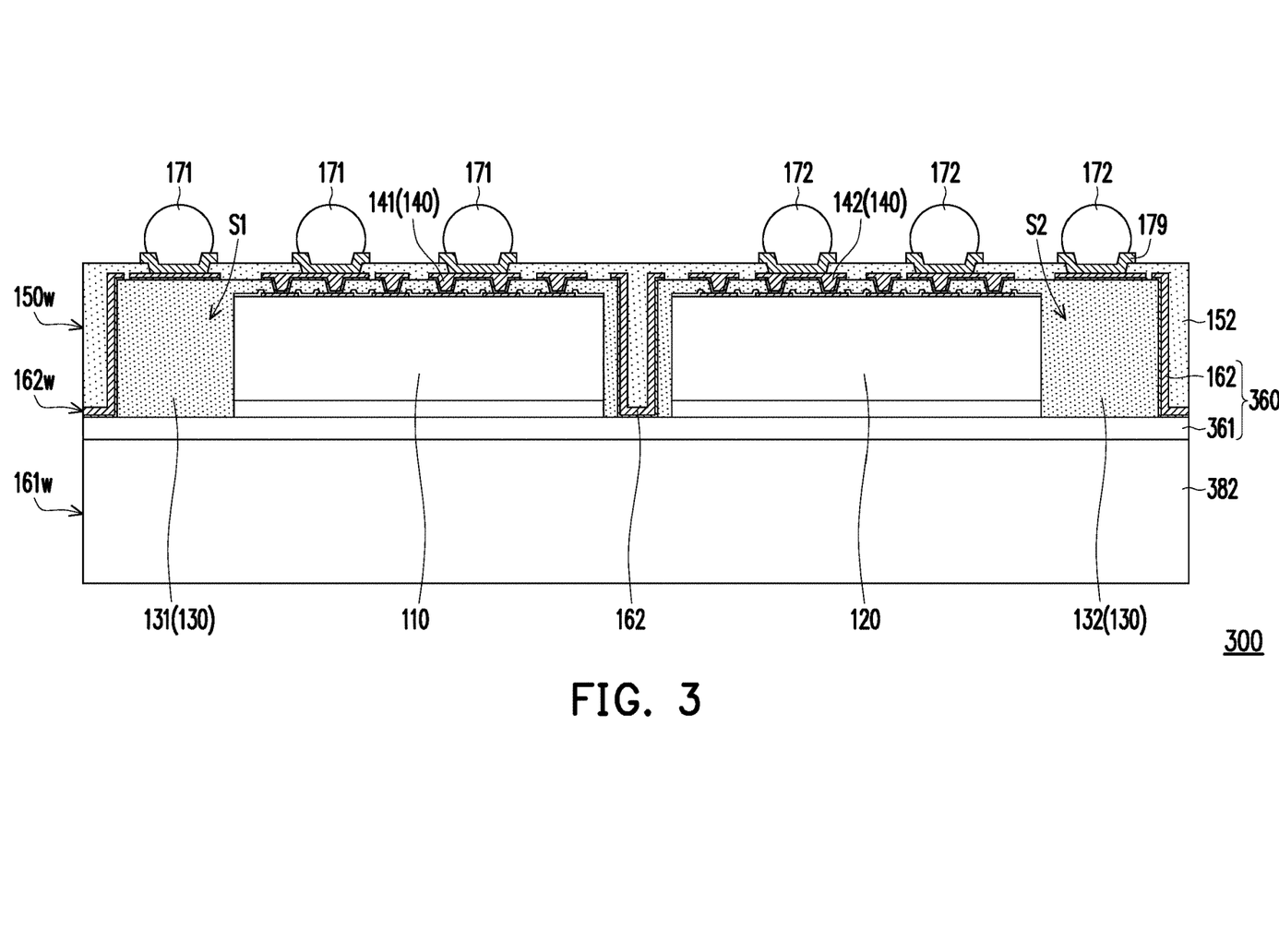
FIG. 3 is a schematic partial cross-sectional view of a package structure according to a third embodiment of the disclosure.

FIG. 3 is a schematic partial cross-sectional view of a package structure according to a third embodiment of the disclosure. A package structure 300 of the third embodiment is similar to the package structure 100 of the first embodiment, and similar components of the package structure 300 are denoted by the same reference numerals, and have the similar functions, materials, or formation means, therefore the description is omitted.

With reference to FIG. 3, the package structure 300 may include a conductive element 360, the multiple dies 110 and 120, the dielectric body 130, the circuit layer 140, and the patterned insulating layer 150.

In the embodiment, a carrier 382 may be a block-shaped insulating plate, and a conductive layer 361 may be provided on a surface of the carrier 382. The conductive layer 361 and the second conductive portion 162 electrically connected to each other may be referred to as a conductive element 360. The first die 110 and the second die 120 may be disposed on the conductive layer 361 (may be referred to as a first conductive portion) that constitutes the conductive element 360.

In the embodiment, the carrier 382 and the conductive layer 361 disposed on the carrier 382 may be suitable for carrying the structure formed thereon or the components disposed thereon during a manufacturing process of the package structure 300. The conductive layer 361 may be a single film layer or multiple film layers stacked together.

In summary, the carrier configured to carry in the manufacturing process of the package structure may serve as a portion of the conductive element in the package structure, while the second conductive portion, serving as the other portion of the conductive element, and the circuit layer configured to be electrically connected to the dies may be in the same film layer. In addition, the conductive element surrounding the dies can reduce the interference experienced by the dies due to the external electromagnetic wave signal. In this way, the manufacturing process of the package structure is simple, and the yield and quality of the package structure are good.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A package structure, comprising:
   a conductive element;
   a plurality of dies disposed on the conductive element, wherein a portion of the conductive element surrounds the plurality of dies;
   a dielectric body covering the plurality of dies;
   a circuit layer disposed on the dielectric body and electrically connected to the plurality of dies; and
   a patterned insulating layer covering the circuit layer, wherein a portion of the patterned insulating layer is disposed between the dies that are adjacent, wherein the conductive element comprises a first conductive portion and a second conductive portion, the dielectric body is disposed on the first conductive portion, the second conductive portion that surrounds each of the plurality of dies, wherein a side wall of the first conductive portion of the conductive element, a side wall of the second conductive portion of the conductive element and a side wall of the patterned insulating layer are substantially flush.

2. The package structure according to claim 1, wherein the plurality of dies comprise a substrate, a die connection pad, and a die protective layer, the die connection pad is disposed on the substrate, the die protective layer covers the substrate and exposes a portion of the die connection pad, and the circuit layer penetrates a portion of the dielectric body to be in direct contact with the die connection pad.

3. The package structure according to claim 1, wherein the circuit layer comprises a first circuit and a second circuit, the plurality of dies comprises a first die and a second die, the first circuit is electrically connected to the first die, the second circuit is electrically connected to the second die, and signals of the first die and the second die are separated from each other.

4. The package structure according to claim 1, wherein the dielectric body comprises a first dielectric portion and a second dielectric portion that are adjacent and separated from each other, and a portion of the conductive element and a portion of the patterned insulating layer are disposed between the first dielectric portion and the second dielectric portion.

5. The package structure according to claim 1, wherein the patterned insulating layer is in contact with the dielectric body, and there is an interface between the patterned insulating layer and the dielectric body.

6. The package structure according to claim 1, further comprising:
an insulating carrier, wherein the conductive element is disposed on the insulating carrier.

7. A package structure, comprising:
a conductive element;
a plurality of dies disposed on the conductive element, wherein a portion of the conductive element surrounds the plurality of dies;
a dielectric body covering the plurality of dies;
a circuit layer disposed on the dielectric body and electrically connected to the plurality of dies; and
a patterned insulating layer covering the circuit layer, wherein a portion of the patterned insulating layer is disposed between the dies that are adjacent, wherein a portion of the conductive element comprises a second conductive portion that surrounds each of the plurality of dies, the patterned insulating layer surrounds the second conductive portion, and the patterned insulating layer is a single layer without an interface therein.

8. A package structure, comprising:
a conductive element;
a plurality of dies disposed on the conductive element, wherein a portion of the conductive element surrounds the plurality of dies;
a dielectric body covering the plurality of dies;
a circuit layer disposed on the dielectric body and electrically connected to the plurality of dies; and
a patterned insulating layer covering the circuit layer, wherein a portion of the patterned insulating layer is disposed between the dies that are adjacent, wherein a maximum thickness of the patterned insulating layer is greater than a maximum thickness of the dielectric body, and the patterned insulating layer is a single layer without an interface therein.

9. A package structure, comprising:
a conductive element;
a plurality of dies disposed on the conductive element, wherein a portion of the conductive element surrounds the plurality of dies;
a dielectric body covering the plurality of dies;
a circuit layer disposed on the dielectric body and electrically connected to the plurality of dies; and
a patterned insulating layer covering the circuit layer, wherein a portion of the patterned insulating layer is disposed between the dies that are adjacent, wherein the dielectric body has a dielectric top surface, a dielectric bottom surface, and a dielectric side surface, the dielectric bottom surface is opposite to the dielectric top surface, and the dielectric side surface is connected to the dielectric top surface and the dielectric bottom surface,
the circuit layer is disposed on the dielectric top surface of the dielectric body,
the conductive element comprises a first conductive portion and a second conductive portion, the dielectric body is disposed on the first conductive portion, and
the second conductive portion at least covers the dielectric side surface, and the second conductive portion of the conductive element and the circuit layer are the same film layer with the same structure formed by the same process.

10. The package structure according to claim 9, wherein the patterned insulating layer exposes a portion of the second conductive portion.

11. The package structure according to claim 9, wherein a bottom surface of the second conductive portion is coplanar with the dielectric bottom surface.

12. The package structure according to claim 9, wherein the first conductive portion and the second conductive portion are in contact with each other, and there is an interface between the first conductive portion and the second conductive portion.

13. The package structure according to claim 9, wherein the first conductive portion comprises a block-shaped conductive carrier, and the second conductive portion comprises a seed layer and a plating layer.

14. A manufacturing method of a package structure, comprising:
providing a carrier having a conductive portion;
disposing a plurality of dies on the conductive portion of the carrier;
forming a dielectric material on the carrier to cover the plurality of dies;
forming a dielectric body that covers the plurality of dies by removing at least a portion of the dielectric material;
forming a patterned conductive layer on the dielectric body, and the patterned conductive layer comprising a circuit layer being electrically connected to the plurality of dies;
forming a patterned insulating layer to cover the patterned conductive layer, and a portion of the patterned insulating layer is disposed between the dies that are adjacent, wherein the package structure, comprising:
a conductive element, wherein a portion of the conductive element is formed by the conductive portion of the carrier;
the plurality of dies disposed on the conductive element, wherein a portion of the conductive element surrounds the plurality of dies;
the dielectric body covering the plurality of dies;
the circuit layer disposed on the dielectric body and electrically connected to the plurality of dies; and
the patterned insulating layer covering the circuit layer, wherein a portion of the patterned insulating layer is disposed between the dies that are adjacent, wherein the conductive element comprises a first conductive portion and a second conductive portion, the dielectric body is disposed on the first conductive portion, the second conductive portion that surrounds each of the plurality of dies, wherein a side wall of the first conductive portion of the conductive element, a side wall of the second conductive portion of the conductive element and a side wall of the patterned insulating layer are substantially flush.

15. The manufacturing method of the package structure according to claim 14, wherein the dielectric body comprises a first dielectric portion and a second dielectric portion separated from each other by a trench, the patterned conductive layer comprises the circuit layer and a second conductive portion, and the second conductive portion conformally covers the trench.

16. The manufacturing method of the package structure according to claim 14, further comprising:
performing a cutting process to cut the carrier, the patterned conductive layer, and the patterned insulating layer.

17. A package structure, comprising:
a conductive element;
a plurality of dies disposed on the conductive element, wherein a portion of the conductive element surrounds the plurality of dies;
a dielectric body covering the plurality of dies;
a circuit layer disposed on the dielectric body and electrically connected to the plurality of dies; and
a patterned insulating layer covering the circuit layer, wherein a portion of the patterned insulating layer is disposed between the dies that are adjacent, wherein
the dielectric body has a dielectric top surface, a dielectric bottom surface, and a dielectric side surface, the dielectric bottom surface is opposite to the dielectric top surface, and the dielectric side surface is connected to the dielectric top surface and the dielectric bottom surface,
the circuit layer is disposed on the dielectric top surface of the dielectric body,
the conductive element comprises a first conductive portion and a second conductive portion,
the dielectric body is disposed on the first conductive portion, and
the second conductive portion is disposed on and covers a portion of the dielectric top surface, and extends and covers the dielectric side surface to contact the first conductive portion.

\* \* \* \* \*